(12) United States Patent
Peng et al.

(10) Patent No.: US 10,867,987 B2
(45) Date of Patent: *Dec. 15, 2020

(54) INTEGRATED CIRCUIT DEVICE HAVING ESD PROTECTION

(71) Applicant: Taiwan Semiconductor Manufacturing Company, Ltd.

(72) Inventors: Po-Lin Peng, Taoyuan (TW); Li-Wei Chu, Hsinchu (TW); Yi-Feng Chang, Xinbei (TW); Jam-Wem Lee, Hsinchu (TW)

(73) Assignee: TAIWAN SEMICONDUCTOR MANUFACTURING COMPANY, LTD.

(*) Notice: Subject to any disclaimer, the term of this patent is extended or adjusted under 35 U.S.C. 154(b) by 595 days.

This patent is subject to a terminal disclaimer.

(21) Appl. No.: 15/720,575

(22) Filed: Sep. 29, 2017

(65) Prior Publication Data

US 2019/0103395 A1    Apr. 4, 2019

(51) Int. Cl.
*H02H 9/00* (2006.01)
*H01L 27/02* (2006.01)
*H01L 21/8234* (2006.01)

(52) U.S. Cl.
CPC .. *H01L 27/0251* (2013.01); *H01L 21/823418* (2013.01); *H01L 27/027* (2013.01); *H01L 27/0248* (2013.01)

(58) Field of Classification Search
None
See application file for complete search history.

(56) References Cited

U.S. PATENT DOCUMENTS

| | | | |
|---|---|---|---|
| 6,066,879 A | 5/2000 | Lee et al. | |
| 6,355,508 B1 | 3/2002 | Porter et al. | |
| 6,465,768 B1 * | 10/2002 | Ker | H01L 21/823842 |
| | | | 250/214.1 |
| 6,756,642 B2 | 6/2004 | Lee et al. | |
| 7,208,386 B2 | 4/2007 | Pendharkar | |
| 7,358,571 B2 | 4/2008 | Ko et al. | |
| 7,671,408 B2 | 3/2010 | Denison | |
| 8,536,648 B2 | 9/2013 | Shrivastava et al. | |
| 8,809,961 B2 * | 8/2014 | Tsai | H01L 27/0259 |
| | | | 257/139 |
| 9,711,643 B2 | 7/2017 | Appaswamy et al. | |

* cited by examiner

*Primary Examiner* — Stephen W Jackson
(74) *Attorney, Agent, or Firm* — Merchant & Gould P.C.

(57) ABSTRACT

An integrated circuit device with ESD protection includes a substrate with a well having a first conductivity type formed on the substrate. A drain region has at least one drain diffusion with a second conductivity type implanted in the well and at least one drain conductive insertion on the well. The drain conductive insertion is electrically connected to the drain diffusion and an I/O pad. A source region includes a plurality of source diffusions having the second conductivity type implanted in the well, and the source diffusions are electrically connected to a voltage terminal.

20 Claims, 7 Drawing Sheets

US 10,867,987 B2

INTEGRATED CIRCUIT DEVICE HAVING ESD PROTECTION

BACKGROUND

Protection of integrated circuits (IC) devices from electrostatic discharge (ESD) is important, since ESD can cause substantial damage to such devices. For example, ESD protection for metal-oxide semiconductor (MOS) devices may employ parasitic bipolar transistors arranged to discharge ESD voltages, and drain-extended MOS transistors have been used for ESD protection.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
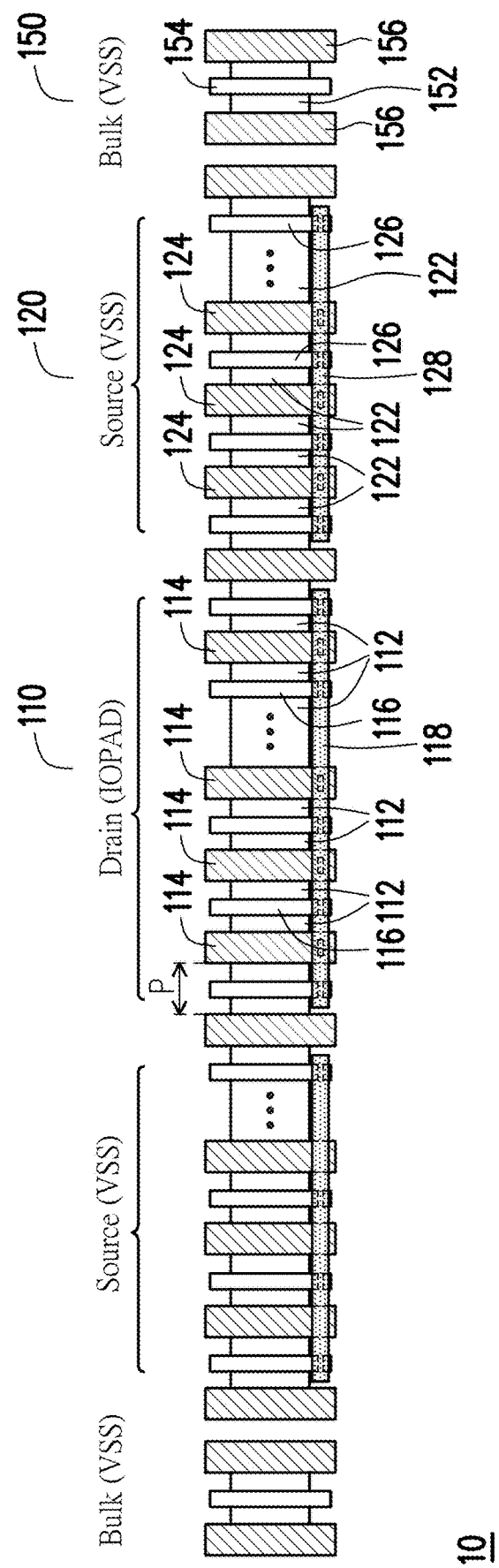
FIG. 1 is a top view schematically illustrating aspects of an example IC device having ESD protection in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Drain-extended metal-oxide semiconductor (MOS) transistors have been used for electro-static discharge (ESD) protection. Such devices have a larger silicon volume for heat dissipation, higher drain side resistance to turn on the device uniformly and a deeper path to avoid the vulnerable device surface during ESD events. However, ESD robustness provided by such drain-extended devices is limited, since the source side area of the drain-extended MOS remains the same. Additionally, the source area of the MOS device cannot necessarily be increased arbitrarily in certain IC manufacturing technologies, such as with vertical device constructions (i.e. FinFET).

In accordance with aspects of the present disclosure, an IC device provides enhanced ESD protection. The IC device has a substrate with a well having a first conductivity type formed on the substrate. A drain region includes at least one drain diffusion having a second conductivity type implanted in the well and at least one drain conductive insertion, such as a polysilicon insertion, on the well. The drain polysilicon insertion is electrically connected to the drain diffusion and an I/O pad. A source region includes a plurality of source diffusions having the second conductivity type implanted in the well, and the source diffusions are electrically connected to a voltage terminal. Accordingly, disclosed examples provide a simple structure and routing style, while increasing an ESD current sinking path and maintaining desired polysilicon spacing to keep high epitaxy quality. Moreover, the disclosed devices and methods are suitable for both planar and vertical IC technologies.

Figure 2:
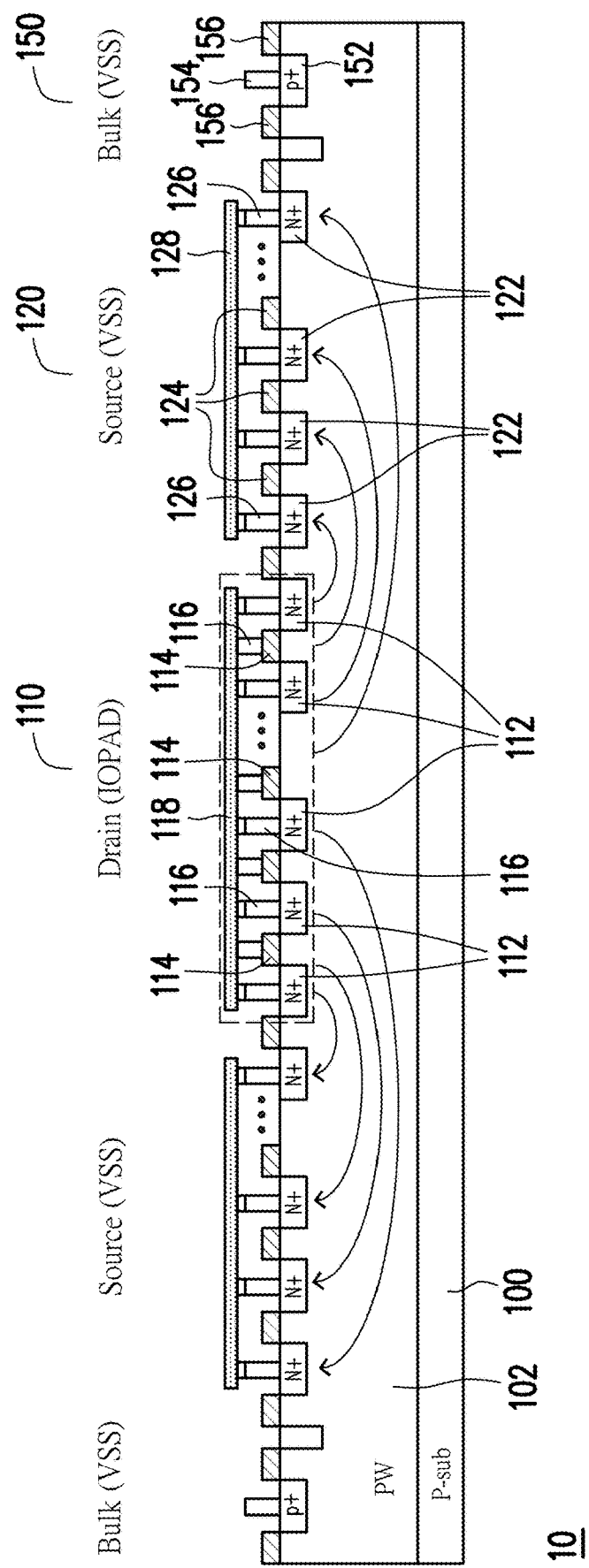
FIG. 2 is a side cross-section view illustrating aspects of the example IC device shown in FIG. 1.

FIG. 1 is a top view, and FIG. 2 is a side-section view illustrating an example IC device in accordance with some disclosed embodiments. The illustrated device 10 includes a substrate 100, which in the example of FIG. 1 is a p-substrate. A well 102 having a first conductivity type is formed on the substrate 100. The example device 10 shown in FIGS. 1 and 2 is an N-type metal-oxide-semiconductor (NMOS) device, and thus the well 102 is a p-well. A drain region 110 is formed by at least one drain diffusion 112 implanted in the p-well 102, and at least one drain conductive insertion 114 deposited on the p-well 102. In the illustrated example, the drain conductive insertions are polysilicon insertions, or "poly gates." The drain diffusion(s) have a second conductivity type. In the illustrated example, the drain region 110 includes a plurality of the diffusions 112 and polysilicon insertions 114. The polysilicon insertions 114 are positioned laterally between the drain diffusions 112. Conductors 116 electrically connect the polysilicon insertions 114 and the drain diffusions 112 to an I/O pad 118.

A source region 120 is formed by a plurality of source diffusions 122 implanted in the p-well 102. The source diffusions 122 also have the second conductivity type. Conductors 126 connect the source diffusions 122 to a voltage terminal 128. As noted previously, the device 10 shown in FIGS. 1 and 2 is an NMOS device, and thus, the drain and source diffusions 112, 122 are n+ diffusions, and the voltage terminal 128 is a $V_{SS}$ terminal.

The source region 120 of the device 10 shown in FIGS. 1 and 2 further includes a plurality of source conductive insertions 124 deposited on the well 102. In the illustrated example, the conductive insertions are polysilicon insertions, or poly gates. In other embodiments, other conductive materials such as metal may be used for the conductive insertions 124. The polysilicon insertions 124 are positioned between the n+ diffusions 122, though in the example of FIGS. 1 and 2, the conductors 126 do not connect the n+ diffusions 122 to the polysilicon insertions 124 or connect the polysilicon insertions 124 to the $V_{SS}$ terminal 128. Instead, the polysilicon insertions 124 float.

The device 10 further includes bulk voltage terminals 150, which are connected to diffusions 152 having the first conductivity type implanted in the well 102. In FIGS. 1 and 2, the bulk voltage diffusions 152 are p+ diffusions, which are connected to the bulk $V_{SS}$ voltage terminal 150 by conductors 154. Conductive insertions 156, such as polysilicon insertions, are deposited on laterally opposite sides of the n+ diffusion 152.

Figure 3:
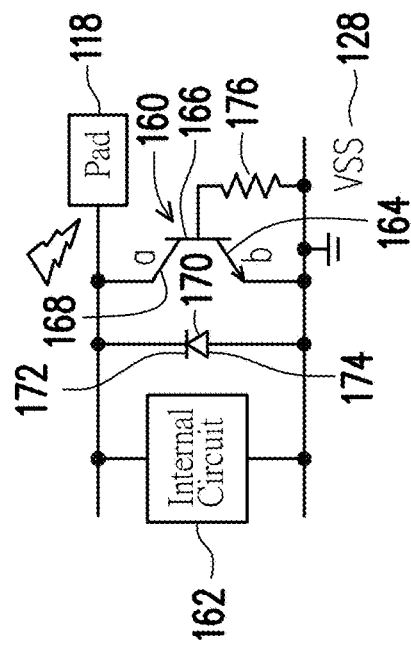
FIG. 3 is a circuit diagram illustrating an equivalent parasitic transistor of the example IC device shown in FIGS. 1 and 2.

The IC device 10 shown in FIGS. 1 and 2 forms a parasitic transistor that provides ESD protection for the internal circuit of the IC device. An equivalent circuit for the parasitic transistor 160 is shown in FIG. 3. The parasitic transistor 160 shown in FIG. 3 is an NPN bipolar transistor that has an emitter 164 formed by the plurality of source n+ diffusions 122, a base 166 formed by the p-well 102, and a collector 168 formed by the drain n+ diffusions 112. Additionally, a parasitic diode 170 is formed by the device 10, which has a cathode 172 formed by the n+ diffusion(s) 112 and an anode 174 formed by the p+ bulk diffusion 152. A resistor 176 represents the resistance of the p-well 102.

During an ESD event, the reversed n+/p-well 112/102 junction (path "a") induces leakage current. The diode 170 formed by the p-well 102/n+ diffusion 112 will then be forward biased (path "b"), and the reverse biased junction is turned on directly (path "a"). The parasitic NPN transistor 160 is therefore turned on and the ESD current flows from path a through path b, in other words, from the I/O pad 118 to the $V_{SS}$ terminal 128, providing an ESD current path to protect the internal circuit 162 of the IC device. However, with known drain-extended MOS devices, the source area is not extended, causing a current "bottleneck." In accordance with aspects of the present disclosure, the extended source region 120 provided by the plurality of source diffusions 122 increases the current sinking path, thus improving ESD protection.

Returning to FIGS. 1 and 2, the illustrated example device 10 includes an equal number of source n+ diffusions 122 and source polysilicon insertions 124. In other words, the ratio of source diffusions 122 to source polysilicon insertions 124 is 1:1. This is also true for the drain diffusions 112 and drain polysilicon insertions 114. Moreover, the polysilicon diffusions 114, 124 are equally spaced apart laterally. That is, the lateral distance between adjacent polysilicon diffusions 114 or 124 defines a common distance P, as shown in FIG. 1. To maintain a desired epitaxial layer quality, the floating source polysilicon insertions 124 are kept at a certain distance P in accordance with design rules. This uniform poly to poly spacing P allows maintaining a desired spacing for epitaxy processes. For instance, with FinFET processes, the epitaxial layer quality is dependent on the polysilicon layer, which provides a "wall" for adhesion of the epitaxial layer.

Figure 4:
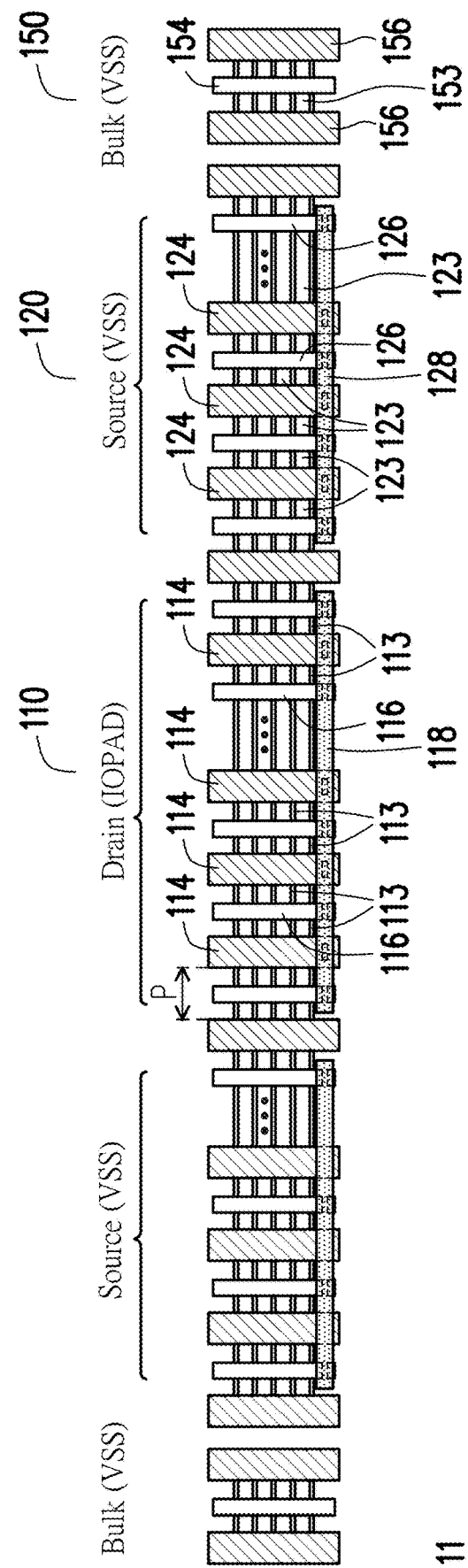
FIG. 4 is a top view schematically illustrating aspects of another example IC device having ESD protection in accordance with some embodiments.

The example device shown in FIG. 1 is a planar MOS structure. The disclosed concepts also apply to non-planar, or vertical structures (i.e. FinFET). FIG. 4 illustrates an example in which the integrated circuit device includes a FinFET MOS device 11. The device 11 shown in FIG. 4 is similar to the device 10 shown in FIG. 1, though the n+ and p+ diffusions are shown as horizontal lines to represent the vertical FinFET structure. Thus, the drain n+ diffusions 113, source n+ diffusions 123, and bulk p+ diffusions 153 are labeled as such to distinguish these diffusions from the planar structures shown in FIG. 1. The vertical structure device 11 also maintains the spacing P between the polysilicon insertions 114, 124, 156.

Figure 5:
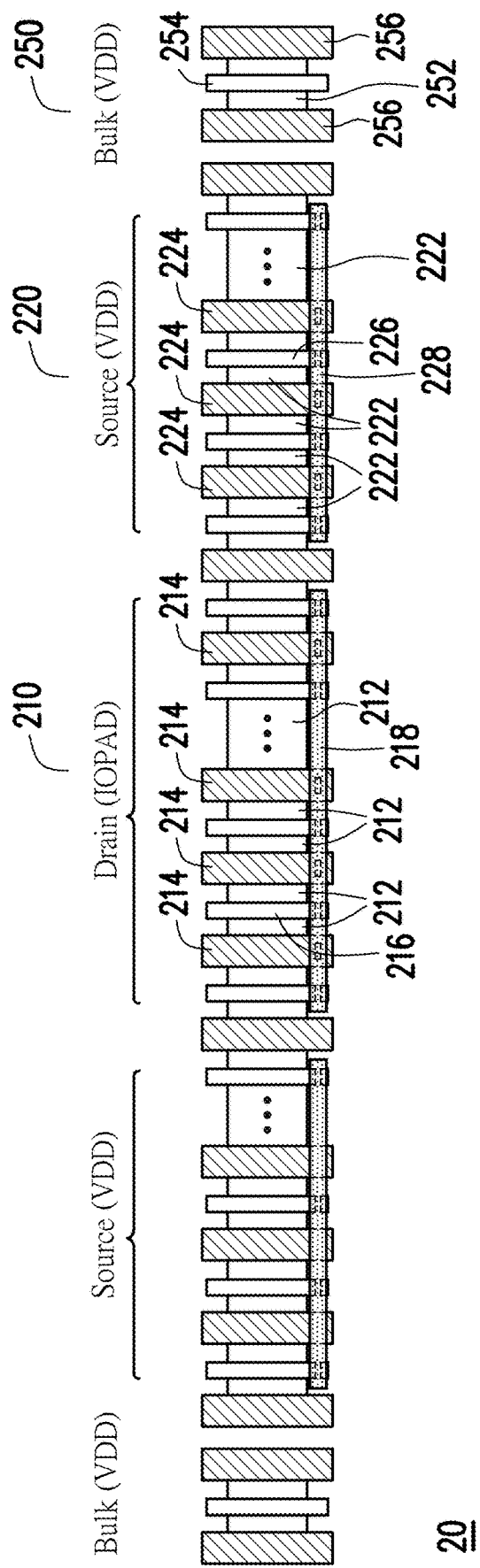
FIG. 5 is a top view schematically illustrating aspects of another example IC device having ESD protection in accordance with some embodiments.
Figure 6:
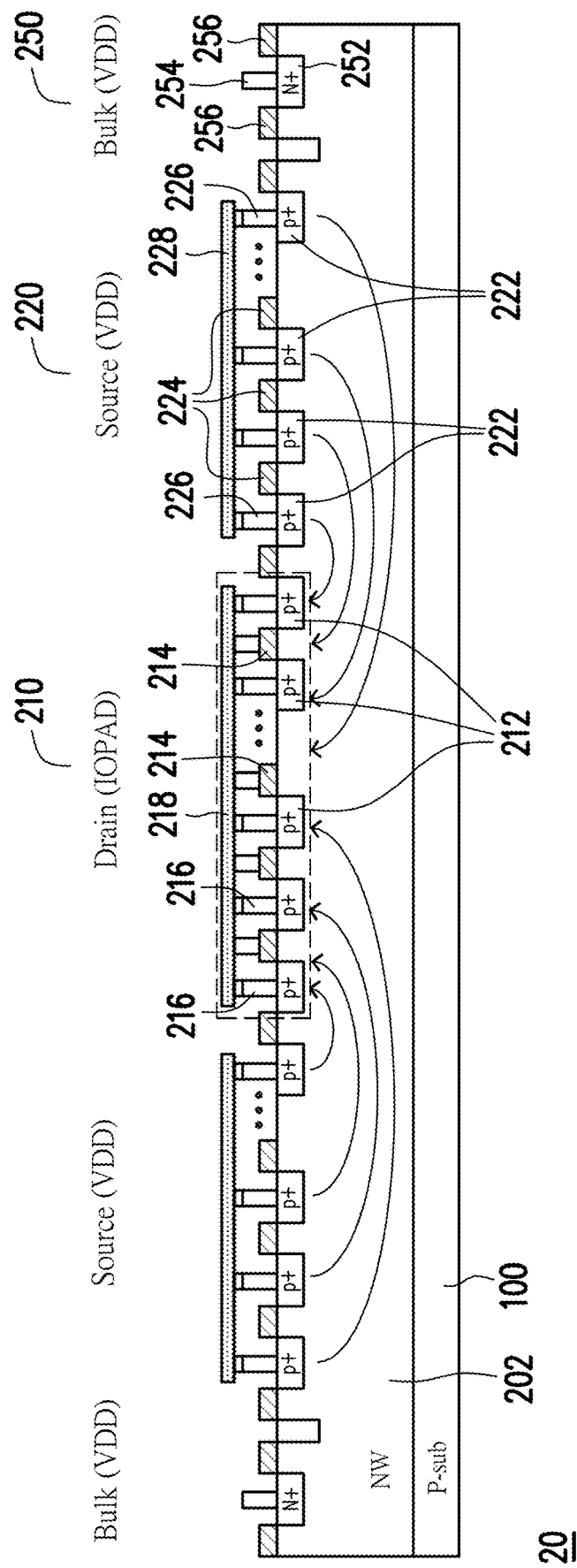
FIG. 6 is a side cross-section view illustrating aspects of the example IC device shown in FIG. 5.

The disclosed examples are not only applicable to NMOS devices. FIGS. 5 and 6 illustrate an example in which the IC device is a positive metal-oxide semiconductor (PMOS) device 20. Thus, the conductivity types referred to in conjunction with FIGS. 1 and 2 are generally reversed. In the example of FIGS. 5 and 6, a well 202 is formed on the p-substrate 100, which is an n-well 202. A drain region 210 is formed by at least one drain p+ diffusion 212 implanted in the n-well 202, and at least one drain polysilicon insertion 214 deposited on the n-well 202. The drain 210 shown in FIGS. 5 and 6 includes a plurality of the p+ diffusions 212 and polysilicon insertions 214. The polysilicon insertions 214 are positioned laterally between the diffusions 212. Conductors 216 electrically connect the polysilicon insertions 214 and the drain p+ diffusions 212 to an I/O pad 218.

A source region 220 is formed by a plurality of source p+ diffusions 222 implanted in the p-well 202. Conductors 226 connect the source diffusions 222 to a voltage terminal 228, which is a $V_{DD}$ voltage terminal in the example of FIGS. 5 and 6. A plurality of source polysilicon insertions 224 are deposited on the n-well 202. The polysilicon insertions 224 are positioned between the p+ diffusions 222, and in the example of FIGS. 5 and 6, the conductors 226 do not connect the p+ diffusions 222 to the polysilicon insertions 224 or connect the polysilicon insertions 224 to the $V_{DD}$ terminal 228.

Bulk voltage terminals 250 are connected to n+ diffusions 252 implanted in the n-well 202. The n+ diffusions 252 are connected to the bulk $V_{DD}$ voltage terminal 250 by conductors 254, and polysilicon insertions 256 are deposited on laterally opposite sides of the p+ diffusion 252.

Figure 7:
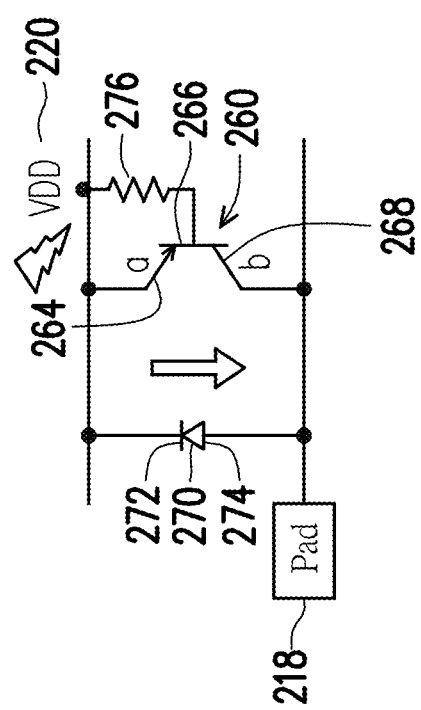
FIG. 7 is a circuit diagram illustrating an equivalent parasitic transistor of the example IC device shown in FIGS. 5 and 6.

An equivalent circuit for the parasitic transistor 260 formed by the IC device 20 shown in FIGS. 5 and 6 is illustrated in FIG. 7. The parasitic transistor 260 is an PNP bipolar transistor that has an emitter 264 formed by the plurality of source p+ diffusions 222, a base 266 formed by the n-well 202, and a collector 268 formed by the drain p+ diffusions 212. A parasitic diode 270 is also formed by the device 20, which has a cathode 272 formed by the n+ diffusion 252 and an anode 274 formed by the p+ diffusion(s) 212. A resistor 276 represents the resistance of the n-well 202.

Referring to FIG. 7, during an ESD event, the reverse biased n-well 202/p+ junction 212 (path "b") would induce leakage current. The diode 270 will then be forward biased (path "a") and the reverse biased junction can turn on directly (path "b"). The parasitic PNP path is therefore turned on and the ESD current flows through path a to path b.

Figure 8:
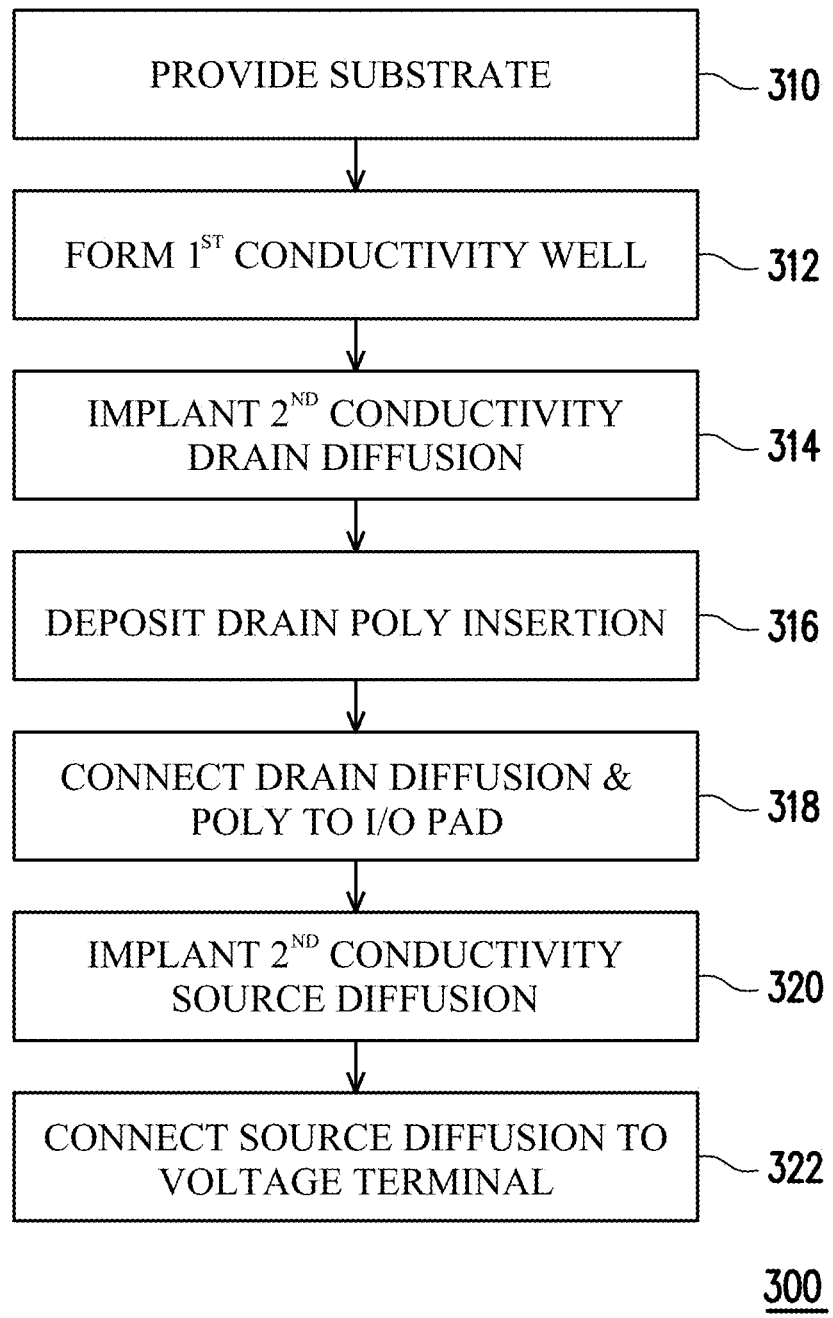
FIG. 8 is a process flow diagram illustrating aspects of a method for providing ESD protection to an IC device in accordance with some embodiments.

FIG. 8 illustrates an example of a method 300 for providing ESD protection to an IC device such as those shown in FIGS. 1-8. The illustrated method 300 includes providing a substrate in block 310. In the examples shown in FIGS. 1-8, the substrate is a p-substrate 100. In block 312, a well having a first conductivity type is formed on the substrate. For the NMOS device 10, the first conductivity type is positive, and the well is a p-well 102. For the PMOS device 20, the first conductivity type is negative, and the well is an n-well 202.

In block 314, at least one drain diffusion having a second conductivity type is implanted in the well. For the NMOS device 10, the second conductivity type is negative, and drain diffusion(s) are n+ diffusions 112. For the PMOS device 20, the second conductivity type is positive, and the drain diffusion(s) are p+ diffusions 212. At least one drain polysilicon insertion is deposited on the well in block 316, and in block 318, the drain diffusion and drain polysilicon are electrically connected to an I/O pad.

In block 320, a plurality of source diffusions having the second conductivity type are implanted in the well. For the NMOS device 10, the source diffusions are n+ diffusions 122, and for the PMOS device 20, the source diffusions are p+ diffusions 222. The source diffusions are electrically connected to a voltage terminal in block 322. For the NMOS device 10, the voltage terminal is a $V_{SS}$ terminal, and for the PMOS device 20, the voltage terminal is a $V_{DD}$ terminal.

As noted previously, a parasitic transistor is formed that includes an emitter formed by the plurality of source diffusions, a base formed by the well, and a collector formed by the at least one drain diffusion. The parasitic transistor provides an ESD current path between the voltage terminal and the I/O pad.

Thus, disclosed examples provide a simple device structure layout that increases the ESD current sinking path, while maintaining desired polysilcon spacing to keep high epitaxy quality. Moreover, the disclosed devices and methods are suitable for both planar and vertical IC technologies.

Disclosed embodiments include an integrated circuit device having ESD protection that includes a substrate, a well having a first conductivity type formed on the substrate, a drain region comprising at least one drain diffusion having a second conductivity type implanted in the well and at least one drain conductive insertion, such as a polysilicon insertion, on the well. The drain polysilicon insertion is electrically connected to the drain diffusion and an I/O pad. A source region includes a plurality of source diffusions having the second conductivity type implanted in the well, and the source diffusions are electrically connected to a voltage terminal.

In accordance with further disclosed embodiments, a method for providing ESD protection to an integrated circuit device includes providing a substrate, and forming a well having a first conductivity type on the substrate. At least one drain diffusion having a second conductivity type is implanted in the well, and at least one drain conductive insertion is deposited on the well. The at least one drain diffusion and the at least one drain conductive insertion are electrically connected to an I/O pad. A plurality of source diffusions having the second conductivity type are implanted in the well, and the source diffusions are electrically connected to a voltage terminal. A parasitic transistor formed by the resulting device includes an emitter formed by the plurality of source diffusions, a base formed by the well, and a collector formed by the at least one drain diffusion. The parasitic transistor provides an ESD current path between the voltage terminal and the I/O pad.

In accordance with still further disclosed embodiments, an integrated circuit device with ESD protection includes a substrate with a well having a first conductivity type formed on the substrate. A parasitic transistor has an emitter formed by a plurality of source diffusions having a second conductivity type implanted in the well, a base formed by the well, and a collector formed by at least one drain diffusion having the second conductivity type implanted in the well.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit device with ESD protection, comprising:
   a substrate;
   a well having a first conductivity type formed on the substrate;
   a drain region comprising a plurality of drain diffusions having a second conductivity type implanted in the well and a plurality of drain polysilicon insertions on the well, the drain polysilicon insertions being electrically connected to the drain diffusion and an I/O pad; and
   a source region comprising a plurality of source diffusions having the second conductivity type implanted in the well, the source diffusions being electrically connected to a voltage terminal.

2. The integrated circuit device of claim 1, further comprising a parasitic transistor having an emitter formed by the plurality of source diffusions, a base formed by the well, and a collector formed by the at least one drain diffusion.

3. The integrated circuit device of claim 1, further comprising conductors connected between the plurality of the drain diffusions and the I/O pad, and between the plurality of the polysilicon insertions and the I/O pad.

4. The integrated circuit device of claim 1, wherein the source further comprises a plurality of source conductive insertions on the well.

5. The integrated circuit device of claim 4, wherein the source conductive insertions are polysilicon insertions, and wherein the integrated circuit device further comprises conductors connected between the plurality of source diffusions and the voltage terminal.

6. The integrated circuit device of claim 5, wherein the plurality of source polysilicon insertions are not electrically connected to the voltage terminal by the conductors.

7. The integrated circuit device of claim 1, wherein the plurality of source diffusions and the plurality of source polysilicon insertions define a 1:1 ratio.

8. The integrated circuit device of claim 4, wherein the plurality of source polysilicon insertions are equally spaced.

9. The integrated circuit device of claim 1, wherein the well is a p-well, the at least one drain insertion is an n+ diffusion, and the plurality of source diffusions are n+ diffusions.

10. The integrated circuit device of claim 1, wherein the well is an n-well, the at least one drain insertion is a p+ diffusion, and the plurality of source diffusions are p+ diffusions.

11. The integrated circuit device of claim 1, wherein the integrated circuit device includes a planar MOS device.

12. The integrated circuit device of claim 1, wherein the integrated circuit device includes a vertical MOS device.

13. The integrated circuit device of claim 1, further comprising a bulk diffusion having the first conductivity type implanted in the well, the bulk diffusion being electrically connected to the voltage terminal.

14. The integrated circuit device of claim 13, further comprising a parasitic diode having a cathode formed by the bulk diffusion, and an anode formed by the at least one drain diffusion.

15. A method of providing ESD protection to an integrated circuit device, comprising:
   providing a substrate;
   forming a well having a first conductivity type on the substrate;
   implanting at least one drain diffusion having a second conductivity type in the well;
   depositing at least one drain conductive insertion on the well;
   electrically connecting the at least one drain diffusion and the at least one drain polysilicon insertion to an I/O pad;
   implanting a plurality of source diffusions having the second conductivity type in the well; and
   electrically connecting the source diffusions to a voltage terminal;
   wherein a parasitic transistor includes an emitter formed by the plurality of source diffusions, a base formed by the well, and a collector formed by the at least one drain diffusion, and wherein the parasitic transistor provides an ESD current path between the voltage terminal and the I/O pad.

16. The method of claim 15, wherein implanting the at least one drain diffusion comprises implanting a plurality of the drain diffusions in the well, and wherein depositing the at least one drain conductive insertion comprises depositing a plurality of drain polysilicon insertions on the well.

17. The method of claim 15, further comprising depositing a plurality of source polysilicon insertions on the well.

18. The method of claim 17, wherein the plurality of source diffusions and the plurality of source polysilicon insertions define a 1:1 ratio.

19. An integrated circuit device with ESD protection, comprising:
   a substrate;
   a well having a first conductivity type formed on the substrate;
   a drain region comprising at least one drain diffusion having a second conductivity type implanted in the well and at least one drain conductive insertion on the well, the drain conductive insertion being electrically connected to the drain diffusion and an I/O pad;
   a source region comprising a plurality of source diffusions having the second conductivity type implanted in the well, the source diffusions being electrically connected to a voltage terminal;
   a bulk diffusion having the first conductivity type implanted in the well, the bulk diffusion being electrically connected to the voltage terminal; and
   a parasitic transistor having an emitter formed by the plurality of source diffusions, a base formed by the well, and a collector formed by the at least one drain diffusion.

20. The integrated circuit device of claim 19, wherein the drain conductive insertions are polysilicon insertions, and wherein the drain comprises a plurality of the drain diffusions and a plurality of the drain polysilicon insertions.

\* \* \* \* \*